US012610588B2

(12) United States Patent
Yoo et al.

(10) Patent No.: US 12,610,588 B2
(45) Date of Patent: Apr. 21, 2026

(54) SEMICONDUCTOR DEVICE AND SEMICONDUCTOR MEMORY CELL INCLUDING THE SAME

(71) Applicant: SAMSUNG ELECTRONICS CO., LTD., Suwon-si (KR)

(72) Inventors: Sungwon Yoo, Suwon-si (KR); Yongseok Kim, Suwon-si (KR); Min Tae Ryu, Suwon-si (KR); Huije Ryu, Suwon-si (KR); Yongjin Lee, Suwon-si (KR); Wonsok Lee, Suwon-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 490 days.

(21) Appl. No.: 18/092,973

(22) Filed: Jan. 4, 2023

(65) Prior Publication Data

US 2023/0307551 A1     Sep. 28, 2023

(30) Foreign Application Priority Data

Mar. 28, 2022     (KR) ........................ 10-2022-0038017

(51) Int. Cl.
*H10D 30/67*     (2025.01)
*H10B 12/00*     (2023.01)
*H10F 39/00*     (2025.01)
(52) U.S. Cl.
CPC ....... *H10D 30/6756* (2025.01); *H10B 12/315* (2023.02); *H10D 30/6729* (2025.01); *H10D 30/6757* (2025.01); *H10F 39/80377* (2025.01)

(58) Field of Classification Search
CPC ........... H10D 30/6757; H10D 30/6755; H10D 30/6756
See application file for complete search history.

(56) References Cited

U.S. PATENT DOCUMENTS 8,158,976 B2     4/2012   Son et al.
9,660,100 B2 *   5/2017   Okazaki ................. H10D 87/00
(Continued)

FOREIGN PATENT DOCUMENTS

JP     2007-220816 A     8/2007
JP       6821982 B2     1/2021
(Continued)

OTHER PUBLICATIONS

Nomura et al., Nature, vol. 432, pp. 488-492 (Nov. 25, 2004).

*Primary Examiner* — Vincent Wall
(74) *Attorney, Agent, or Firm* — Muir Patent Law, PLLC

(57)     ABSTRACT

A semiconductor device includes a substrate, a gate electrode on the substrate, a channel layer between the substrate and the gate electrode, a source electrode in contact with a first sidewall of the channel layer, and a drain electrode in contact with a second sidewall of the channel layer. The second sidewall is opposite to the first sidewall. The channel layer includes a first channel pattern in contact with one of the source electrode and the drain electrode, and a second channel pattern between the first channel pattern and the gate electrode. The first channel pattern and the second channel pattern includes oxide semiconductor materials different from each other. A portion of the source electrode and a portion of the drain electrode overlap a portion of the gate electrode.

12 Claims, 14 Drawing Sheets

(56)                    References Cited

U.S. PATENT DOCUMENTS

| | | | | |
|---|---|---|---|---|
| 10,096,715 B2 * | 10/2018 | Yamazaki | .......... | H10D 30/6704 |
| 10,916,663 B2 | 2/2021 | Yamazaki et al. | | |
| 11,081,502 B2 | 8/2021 | Yamazaki | | |
| 11,133,420 B2 * | 9/2021 | Iida | ................... | H01L 21/31116 |
| 11,183,600 B2 * | 11/2021 | Yamazaki | .......... | H10D 30/6755 |
| 11,296,233 B2 * | 4/2022 | Yamazaki | ........... | H10D 64/517 |
| 11,362,647 B2 * | 6/2022 | Okamoto | ............... | G06G 7/186 |
| 11,387,330 B2 * | 7/2022 | Yamazaki | ............. | H10D 62/80 |
| 11,527,657 B2 * | 12/2022 | Hata | .................. | H10D 30/6755 |
| 2002/0160568 A1 | 10/2002 | Durcan et al. | | |
| 2008/0191204 A1 * | 8/2008 | Kim | ................... | H10D 30/6755 |
| | | | | 257/E29.094 |
| 2009/0224238 A1 * | 9/2009 | Kim | ................... | H10D 30/6755 |
| | | | | 438/151 |
| 2011/0215328 A1 | 9/2011 | Morosawa et al. | | |
| 2012/0085999 A1 * | 4/2012 | Song | ................... | H10F 39/197 |
| | | | | 257/E31.083 |
| 2012/0187395 A1 * | 7/2012 | Koezuka | ............ | H10D 30/6756 |
| | | | | 257/E29.296 |
| 2013/0009220 A1 * | 1/2013 | Yamazaki | ............ | H10D 30/504 |
| | | | | 257/288 |
| 2014/0138675 A1 * | 5/2014 | Yamazaki | .......... | H10D 30/6739 |
| | | | | 257/43 |
| 2016/0064525 A1 | 3/2016 | Yamazaki | | |
| 2016/0233339 A1 * | 8/2016 | Okazaki | ............... | H10D 86/423 |
| 2019/0318924 A1 * | 10/2019 | Yamazaki | ............ | H01L 21/022 |
| 2020/0235246 A1 * | 7/2020 | Sharma | ............. | H10D 30/6713 |
| 2021/0279449 A1 * | 9/2021 | Yamazaki | ............ | G06V 40/176 |

FOREIGN PATENT DOCUMENTS

| | | |
|---|---|---|
| KR | 1020140063445 A | 5/2014 |
| KR | 1020200068800 A | 6/2020 |
| TW | 202036919 A | 10/2020 |

* cited by examiner

102

101

100

I                                                                                    I'

D3

D1

D2

CH

CHP2  CHP1

SP1                                                                           DP1

101

100

I                                                                                    I'

D3

D1

D2

SEMICONDUCTOR DEVICE AND SEMICONDUCTOR MEMORY CELL INCLUDING THE SAME

CROSS-REFERENCE TO RELATED APPLICATION

This U.S. nonprovisional application claims priority under 35 U.S.C § 119 to Korean Patent Application No. 10-2022-0038017, filed on Mar. 28, 2022, in the Korean Intellectual Property Office, the disclosure of which is hereby incorporated by reference in its entirety.

BACKGROUND

1 Field

Embodiments relate to a semiconductor device and a semiconductor memory cell including the same, and more particular, to a semiconductor device including an oxide semiconductor transistor structure, a method of fabricating the same, and a semiconductor memory cell including the same.

2. Description of the Related Art

A transistor may be used as a switching device or a driving device in the electronic device field. In particular, because a thin film transistor can be manufactured even on a glass substrate or a plastic substrate, the thin film transistor is valuably utilized in the field of display, e.g., an organic light emitting display or a liquid crystal display.

The performance of a thin film transistor mainly depends on physical properties of a channel layer (e.g., a semiconductor layer). Therefore, a thin film transistor having excellent performance is required to achieve semiconductor circuits of next-generation high performance and integration, and in connection with this, research is being conducted on an oxide thin film transistor in which an oxide semiconductor with high carrier mobility is used as a material for the channel layer.

SUMMARY

According to some embodiments, a semiconductor device may include a substrate; a gate electrode on the substrate; a channel layer between the substrate and the gate electrode; a source electrode in contact with a first sidewall of the channel layer; and a drain electrode in contact with a second sidewall of the channel layer. The second sidewall may be opposite to the first sidewall. The channel layer may include a first channel pattern in contact with one of the source electrode and the drain electrode; and a second channel pattern between the first channel pattern and the gate electrode. The first channel pattern and the second channel pattern may include oxide semiconductor materials different from each other. A portion of the source electrode and a portion of the drain electrode may overlap a portion of the gate electrode.

According to some embodiments, a semiconductor device may include a substrate; a gate electrode on the substrate; a channel layer between the substrate and the gate electrode; a source electrode in contact with a first sidewall of the channel layer; and a drain electrode in contact with a second sidewall of the channel layer. The second sidewall may be opposite to the first sidewall. The source electrode and the drain electrode may be spaced apart from each other in a first direction parallel to a top surface of the substrate. The gate electrode may extend in a second direction that intersects the first direction and is parallel to the top surface of the substrate. The channel layer may include a first channel pattern in contact with one of the source electrode and the drain electrode; and a second channel pattern between the first channel pattern and the gate electrode. The first channel pattern and the second channel pattern may include oxide semiconductor materials different from each other. A portion of the source electrode and a portion of the drain electrode may overlap in a third direction with a portion of the gate electrode. The third direction may be perpendicular to the top surface of the substrate.

According to some embodiments, a semiconductor memory cell may include a substrate; a semiconductor device on the substrate; a landing pad on the semiconductor device; and a capacitor that includes a plurality of bottom electrodes, a top electrode, and a dielectric layer between the bottom electrodes and the top electrode. The capacitor may be connected through the landing pad to the semiconductor device. The semiconductor device may include a gate electrode on the substrate; a channel layer between the substrate and the gate electrode; a source electrode in contact with a first sidewall of the channel layer; and a drain electrode in contact with a second sidewall of the channel layer. The second sidewall may be opposite to the first sidewall. The channel layer of the semiconductor device may include a first channel pattern in contact with one of the source electrode and the drain electrode, the first channel pattern including a crystalline oxide semiconductor material; and a second channel pattern between the first channel pattern and the gate electrode, the second channel pattern including an amorphous oxide semiconductor material. A portion of the source electrode and a portion of the drain electrode may overlap a portion of the gate electrode.

BRIEF DESCRIPTION OF THE DRAWINGS

Features will become apparent to those of skill in the art by describing in detail exemplary embodiments with reference to the attached drawings, in which.

DETAILED DESCRIPTION

With reference to the accompanying drawings, the following will describe in detail a semiconductor device, a method of fabricating the same, and a semiconductor memory cell including the same according to some embodiments.

Figure 1:
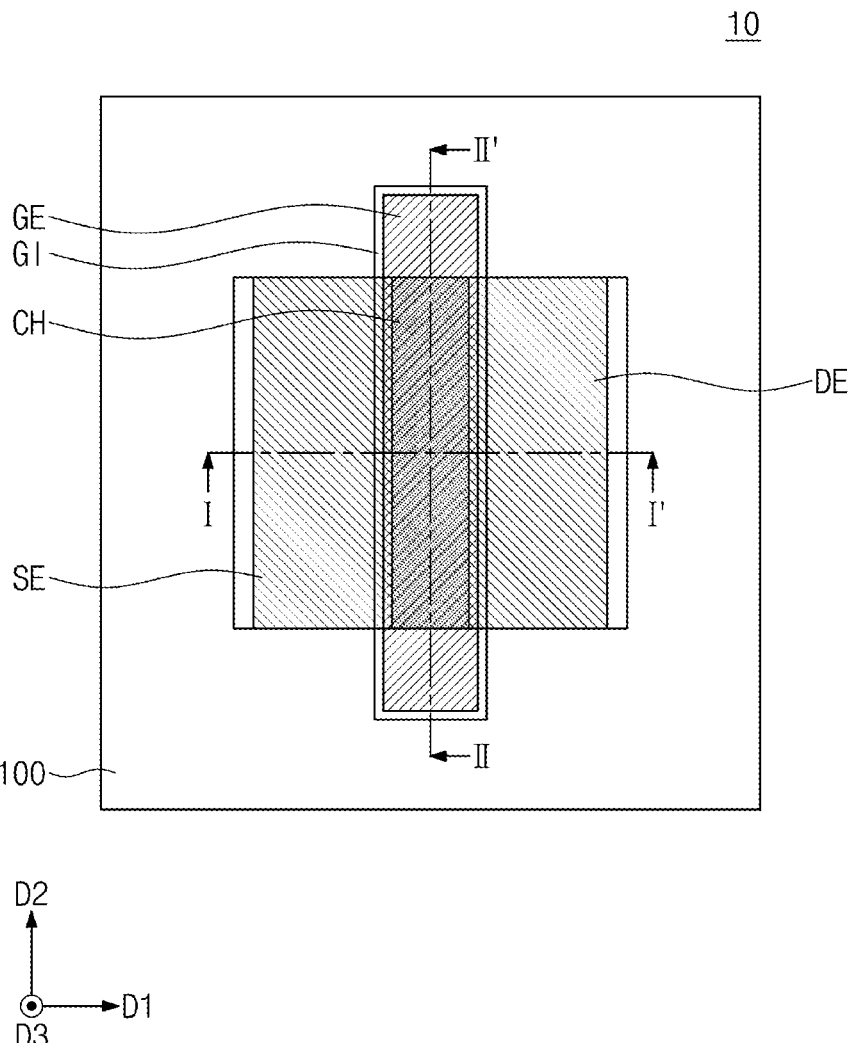
FIG. 1 illustrates a plan view showing a semiconductor device according to some embodiments.
Figure 2:
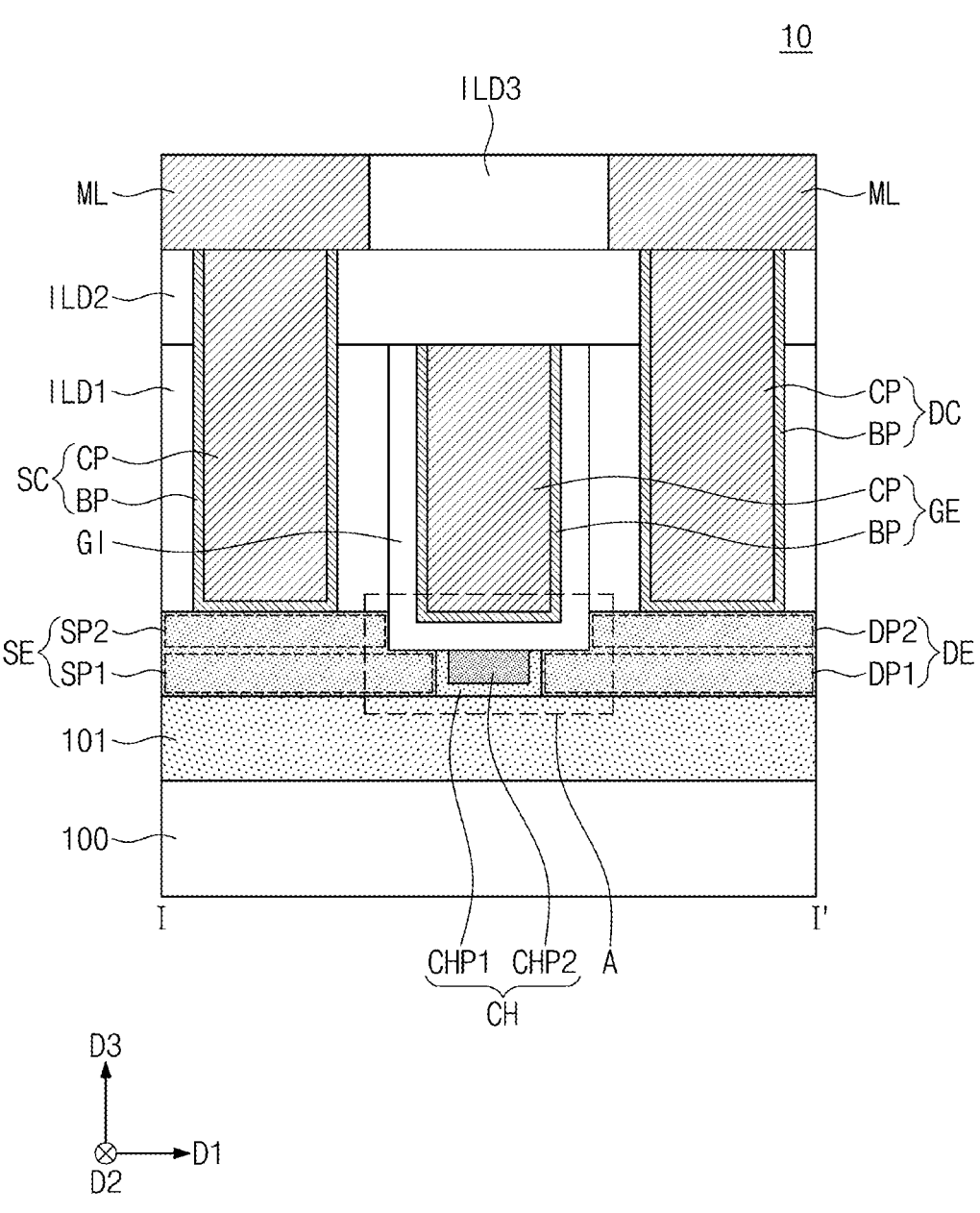
FIGS. 2 and 3 illustrate cross-sectional views respectively taken along lines I-I' and II-II' of FIG. 1.
Figure 3:
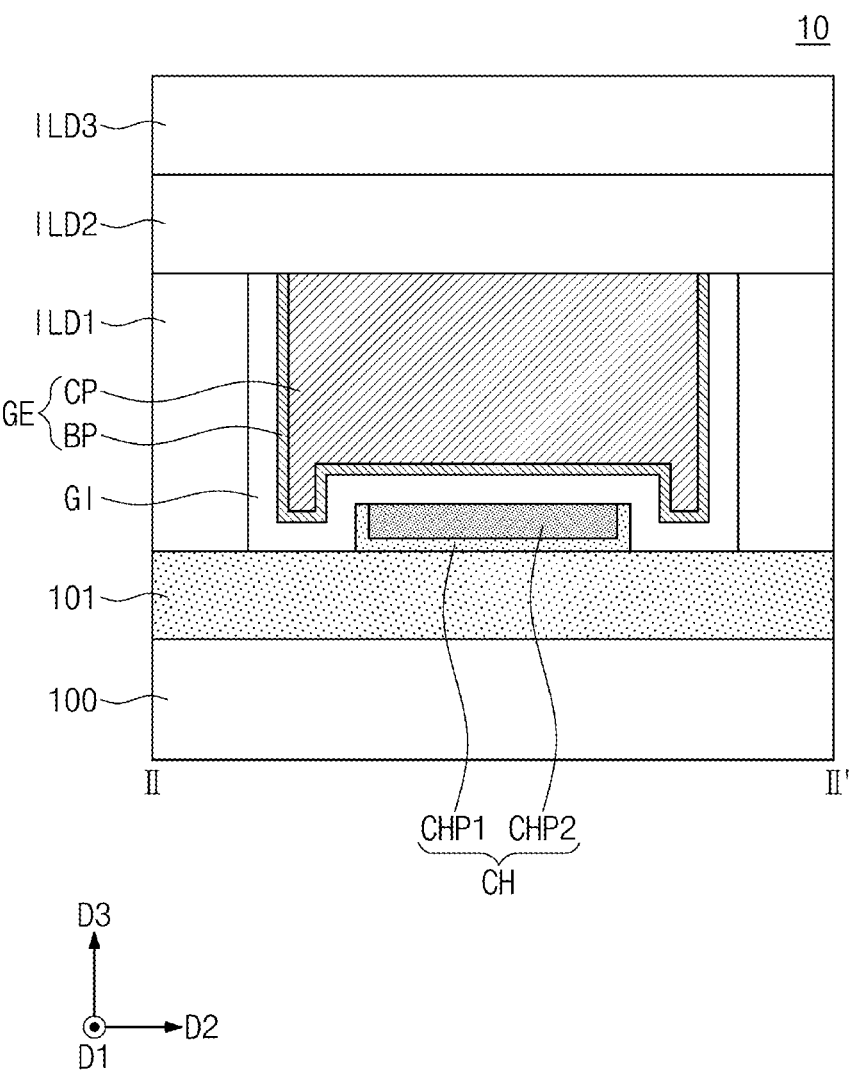

FIG. 1 illustrates a plan view showing a semiconductor device according to some embodiments. FIGS. 2 and 3 illustrate cross-sectional views along lines I-I' and II-II' of FIG. 1, respectively.

Referring to FIGS. 1, 2, and 3, a semiconductor device 10 according to embodiments may include a channel layer CH, a gate electrode GE, a source electrode SE, and a drain electrode DE that are provided on a substrate 100. The semiconductor device 10 according to embodiments may have an oxide semiconductor transistor structure.

The substrate 100 may be, e.g., a semiconductor substrate, a glass substrate, or a plastic substrate. The semiconductor substrate may include, e.g., one or more of silicon, germanium, and silicon-germanium. According to some embodiments, the substrate 100 may be a silicon wafer. The substrate 100 may have a top surface that is parallel to a first direction D1 and a second direction D2 that intersects the first direction D1, and is perpendicular to a third direction D3. The first, second, and third directions D1, D2, and D3 may be, e.g., orthogonal directions to each other.

The semiconductor device 10 according to embodiments may be formed in a front-end-of-line (FEOL) layer, in a back-end-of-line (BEOL) layer, or in a peripheral circuit structure on the substrate 100.

An oxide layer 101 may be provided on the substrate 100. The oxide layer 101 may include, e.g., silicon oxide. According to some embodiments, the oxide layer 101 may be provided in the substrate 100.

A channel layer CH may be provided on the substrate 100. The channel layer CH may include an oxide semiconductor material. The channel layer CH may include, e.g., a compound of oxygen (O) and at least two metals selected from zinc (Zn), indium (In), gallium (Ga), and tin (Sn).

The channel layer CH may include a first channel pattern CHP1 and a second channel pattern CHP2. The second channel pattern CHP2 may be provided on the first channel pattern CHP1. The first channel pattern CHP1 may cover a bottom surface and opposite sidewalls of the second channel pattern CHP2, e.g., the first channel pattern CHP1 may extend continuously along the entire bottom surface and opposite sidewalls of the second channel pattern CHP2. For example, as illustrated in FIGS. 2 and 3, the first channel pattern CHP1 may be conformal along the bottom surface and opposite sidewalls of the second channel pattern CHP2, and a thickness of the second channel pattern CHP2 along the third direction D3 may be larger than a thickness of a horizontal portion of first channel pattern CHP1 (i.e., a part of first channel pattern CHP1 directly under the second channel pattern CHP2) along the third direction D3. For example, as illustrated in FIGS. 2 and 3, uppermost surfaces of the first and second channel patterns CHP1 and CHP2 may be coplanar.

The first and second channel patterns CHP1 and CHP2 may include oxide semiconductor materials that are different from each other. For example, the first channel pattern CHP1 may include a crystalline oxide semiconductor material, and the second channel pattern CHP2 may include an amorphous oxide semiconductor material. The first channel pattern CHP1 may have a contact resistance less than that of the second channel pattern CHP2. The second channel pattern CHP2 may have a carrier mobility, e.g., a measure of how quickly a charge carrier can move through a material, greater than that of the first channel pattern CHP1.

For example, the first channel pattern CHP1 may include c-axis aligned crystal indium-gallium-zinc oxide (CAAC-IGZO) or indium-tin oxide (ITO), and the second channel pattern CHP2 may include indium-gallium-zinc oxide (IGZO), In₂O₃, or indium-tungsten oxide (IWO). According to some embodiments, the second channel pattern CHP2 may include an oxide semiconductor material whose constitution ratio of indium (In) is equal to or greater than about 33.3%.

The source electrode SE and the drain electrode DE may be provided on opposite sides of the channel layer CH. The source electrode SE and the drain electrode DE may be in direct contact with a sidewall of the channel layer CH.

The source electrode SE may include a first source pattern SP1 on the substrate 100 and a second source pattern SP2 on the first source pattern SP1. The source electrode SE may have a step difference at an interface between the first source pattern SP1 and the second source pattern SP2. For example, at least a portion of the first source pattern SP1 may be exposed without being covered with the second source pattern SP2. For example, a length in the first direction D1 of the first source pattern SP1 may be greater than a length in the first direction D1 of the second source pattern SP2. The first source pattern SP1 may be in contact with the channel layer CH. A bottom surface of the first source pattern SP1 may be substantially coplanar with that of the channel layer CH. A top surface of the first source pattern SP1 (or, a bottom surface of the second source pattern SP2) may be substantially coplanar with that of the channel layer CH. A portion of the first source pattern SP1 may overlap in the third direction (or vertically) with a portion of the gate electrode GE.

The drain electrode DE may include a first drain pattern DP1 on the substrate 100 and a second drain pattern DP2 on the first drain pattern DP1. The drain electrode DE may have a step difference at an interface between the first drain pattern DP1 and the second drain pattern DP2. For example, at a portion of the first drain pattern DP1 may be exposed without being covered with the second drain pattern DP2. For example, a length in the first direction D1 of the first drain pattern DP1 may be greater than a length in the first direction D1 of the second drain pattern DP2. The first drain pattern DP1 may be in contact with the channel layer CH. A bottom surface of the first drain pattern DP1 may be substantially coplanar with that of the channel layer CH. A top surface of the first drain pattern DP1 (or, a bottom surface of the second drain pattern DP2) may be substantially coplanar with that of the channel layer CH. A portion of the first drain pattern DP1 may overlap in the third direction D3 (or vertically) with a portion of the gate electrode GE.

Figure 4:
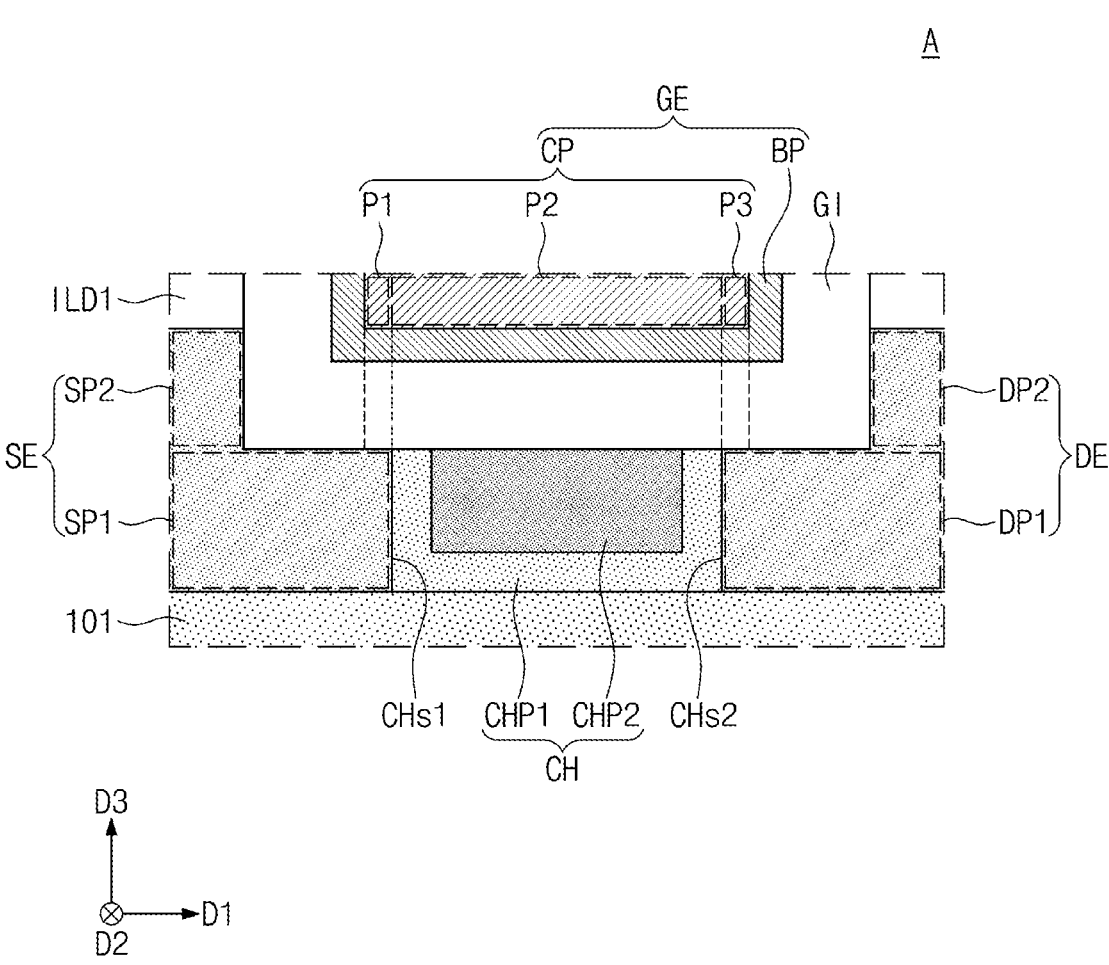
FIG. 4 illustrates an enlarged view of section A in FIG. 2, partially showing a semiconductor device according to some embodiments.

The first drain pattern DP1 may be spaced apart in the first direction D1 from the first source pattern SP1 of the source electrode SE across the channel layer CH. The second drain pattern DP2 may be spaced apart in the first direction D1 from the second source pattern SP2 of the source electrode SE across the gate electrode GE and a gate dielectric pattern GI which will be discussed below. For example, as illustrated in FIGS. 2 and 4, the first channel pattern CHP1 may separate the second channel pattern CHP2 from each of the first source pattern SP1 and the first drain pattern DP1.

The source electrode SE and the drain electrode DE may include a conductive material. For example, the source electrode SE and the drain electrode DE may include at least one of doped semiconductor materials (e.g., doped silicon, doped germanium, etc.), conductive metal nitrides (e.g., titanium nitride, tantalum nitride, tungsten nitride, etc.), and metallic materials (e.g., titanium, tantalum, tungsten, copper, aluminum, ruthenium, molybdenum, etc.).

A first interlayer dielectric layer ILD1 may be provided to cover the source electrode SE and the drain electrode DE.

The first interlayer dielectric layer ILD1 may include at least one of, e.g., silicon oxide, silicon nitride, and silicon oxynitride.

The gate electrode GE may be provided to penetrate the first interlayer dielectric layer ILD1 and to extend, e.g., lengthwise, in the second direction D2. The gate electrode GE may be positioned between the source electrode SE and the drain electrode DE. At least a portion of the gate electrode GE may overlap in the third direction D3 with the first source pattern SP1 of the source electrode SE and with the first drain pattern DP1 of the drain electrode DE. In addition, at least a portion of the gate electrode GE may overlap in the first direction D1 with the second source pattern SP2 of the source electrode SE and with the second drain pattern DP2 of the drain electrode DE. The gate electrode GE may cover the channel layer CH, e.g., completely cover the top surface of the channel layer CH. A width in the first direction D1 of the gate electrode GE may be greater than a width in the first direction D1 of the channel layer CH. A length in the second direction D2 of the gate electrode GE may be greater than a length in the second direction D2 of the channel layer CH. At least a portion, e.g., an edge, of the gate electrode GE may protrude toward the substrate 100, e.g., in the third direction D3, and may overlap in the second direction D2 with the channel layer CH.

The gate electrode GE may include a barrier pattern BP and a conductive pattern CP. The barrier pattern BP may cover sidewalls and a bottom surface of the conductive pattern CP. The barrier pattern BP may include a metal layer and a metal nitride layer. The metal layer may include, e.g., at least one of titanium, tantalum, tungsten, nickel, cobalt, and platinum. The metal nitride layer may include, e.g., at least one of titanium nitride (TiN), tantalum nitride (TaN), tungsten nitride (WN), nickel nitride (NiN), cobalt nitride (CON), and platinum nitride (PtN). The conductive pattern CP may include, e.g., at least one metal of aluminum, copper, tungsten, molybdenum, and cobalt. According to some embodiments, the barrier pattern BP of the gate electrode GE may include the same material as that of the source electrode SE and the drain electrode DE.

A gate dielectric pattern GI may be provided to cover a bottom surface and opposite sidewalls of the gate electrode GE. The gate dielectric pattern GI may be interposed between the gate electrode GE and the first interlayer dielectric layer ILD1 and between the gate electrode GE and the channel layer CH. A bottom surface of the gate dielectric pattern GI may be in direct contact with the top surface of the channel layer CH. A top surface of the gate dielectric pattern GI may be substantially coplanar with that of the gate electrode GE and that of the first interlayer dielectric layer ILD1. The gate dielectric pattern GI may include a material having good interfacial characteristics with an oxide semiconductor material of the channel layer CH, and may minimize and/or prevent hydrogen from entering the channel layer CH in a subsequent process (e.g., annealing process). The gate dielectric pattern GI may include, e.g., at least one of silicon oxide, silicon nitride, silicon oxynitride, and high-k dielectric. The high-k dielectric may be a material with a dielectric constant that is greater than that of silicon oxide or silicon nitride, e.g., hafnium oxide, aluminum oxide, or tantalum oxide.

The first interlayer dielectric layer ILD1 may be provided thereon with a second interlayer dielectric layer ILD2 that covers the top surface of the gate electrode GE. The second interlayer dielectric layer ILD2 may include, e.g., at least one of silicon oxide, silicon nitride, and silicon oxynitride.

The source electrode SE may be provided thereon with a source contact SC that penetrates the first and second interlayer dielectric layers ILD1 and ILD2 and contacts the source electrode SE. The drain electrode DE may be provided thereon with a drain contact DC that penetrates the first and second interlayer dielectric layers ILD1 and ILD2 and contacts the drain electrode DE. The source contact SC and the drain contact DC may have their top surfaces substantially coplanar with that of the second interlayer dielectric layer ILD2. Similar to the gate electrode GE, each of the source contact SC and the drain contact DC may include a barrier pattern BP and a conductive pattern CP. According to some embodiments, the barrier pattern BP of each of the source contact SC and the drain contact DC may include the same material as that of the source electrode SE and the drain electrode DE.

The second interlayer dielectric layer ILD2 may be provided thereon with a third interlayer dielectric layer ILD3 that covers the top surface of the source contact SC and the top surface of the drain contact DC. The third interlayer dielectric layer ILD3 may include, e.g., at least one of silicon oxide, silicon nitride, and silicon oxynitride. The third interlayer dielectric layer ILD3 may be provided therein with wiring lines ML connected to the source contact SC and the drain contact DC. Each of the wiring lines ML may be electrically connected either through the source contact SC to the source electrode SE or through the drain contact DC to the drain electrode DE. The wiring lines ML may include a conductive material. According to some embodiments, the third interlayer dielectric layers ILD3 may further be provided therein with additional wiring lines connected to the wiring lines ML and with vias that connect the additional wiring lines to each other.

FIG. 4 illustrates an enlarged view of section A depicted in FIG. 2, partially showing a semiconductor device according to some embodiments.

Referring to FIG. 4, the conductive pattern CP of the gate electrode GE may include a first portion P1, a second portion P2, and a third portion P3. For example, as illustrated in FIG. 4, the first through third portion P1 through P3 may be arranged sequentially in the stated order along the first direction D1, and may be integral with each other, i.e., constituting a single, uniform, and seamless (e.g., without a visible interface) element.

In detail, the first portion P1 of the conductive pattern CP may overlap in the third direction D3 with the first source pattern SP1 of the source electrode SE. The first portion P1 of the conductive pattern CP may have one sidewall in, e.g., direct, contact with the barrier pattern BP. The one sidewall of the first portion P1 may be above the first source pattern SP1 of the source electrode SE, and may be horizontally spaced apart along the first direction D1 from an extension of a first sidewall CHs1 of the channel layer CH. The second portion P2 of the conductive pattern CP may overlap in the third direction D3 with the channel layer CH. The second portion P2 of the conductive pattern CP may be positioned between the first portion P1 and the third portion P3 of the conductive pattern CP. The third portion P3 of the conductive pattern CP may overlap in the third direction D3 with the first drain pattern DP1 of the drain electrode DE. The third portion P3 of the conductive pattern CP may have one sidewall in, e.g., direct, contact with the barrier pattern BP that is spaced apart in the first direction D1 from a second sidewall CHs2 of the channel layer CH.

FIGS. 5 to 9 illustrate cross-sectional views taken along line I-I' of FIG. 1, showing stages in a method of fabricating a semiconductor device according to some embodiments.

With reference to FIGS. 1 to 4 and 5 to 9, the following will describe in detail a method of fabricating a semiconductor device according to some embodiments.

Figure 5:
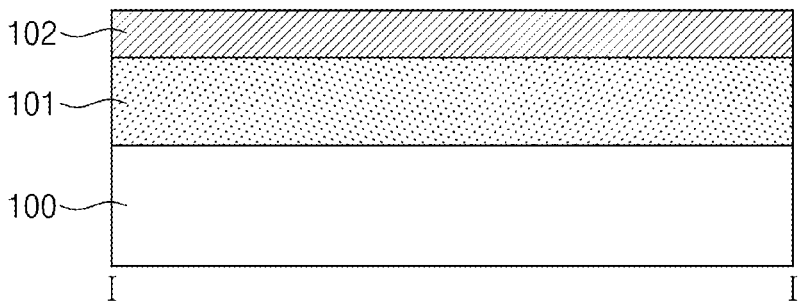
FIGS. 5 to 9 illustrate cross-sectional of stages in a method of fabricating a semiconductor device according to some embodiments.
Figure 5:
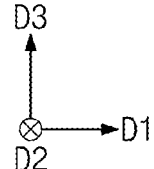
Figure 6:
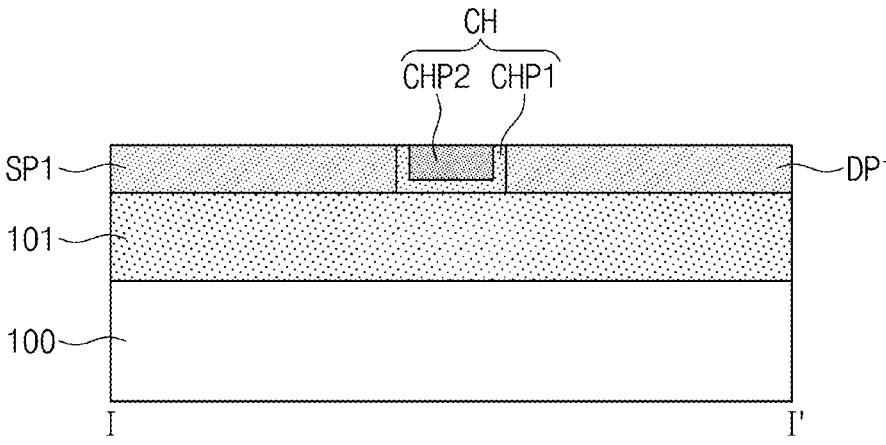
Figure 6:
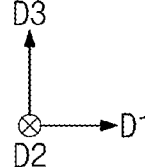

Referring to FIGS. 5 and 6, the oxide layer 101 and a first electrode layer 102 may be sequentially deposited on the substrate 100. The first electrode layer 102 may be patterned until at least a portion of the oxide layer 101 is exposed, such that the first source pattern SP1 and the first drain pattern DP1 may be formed. The first source pattern SP1 and the first drain pattern DP1 may be spaced apart from each other in the first direction D1. The first electrode layer 102 may be patterned to form the channel layer CH in a space that exposes at least a portion of the oxide layer 101, e.g., the channel layer CH may separate the first source pattern SP1 and the first drain pattern DP1 from each other.

The formation of the channel layer CH may include forming, e.g., conformally, a first channel layer in the space that exposes the portion of the oxide layer 101, a top surface of the first source pattern SP1, and on a top surface of the first drain pattern DP1, forming a second channel layer on the first channel layer, and partially removing each of the first and second channel layers by performing a planarization process until exposure of the top surface of the first source pattern SP1 and the top surface of the first drain pattern DP1. The partial removal of each of the first and second channel layers may form the first and second channel patterns CHP1 and CHP2. The channel layer CH may have a top surface substantially coplanar with that of the first source pattern SP1 and that of the first drain pattern DP1. Hereinafter, the phrase "substantially coplanar" means that a planarization process has been performed. The planarization process may include, e.g., a chemical mechanical polishing (CMP) process or an etch-back process.

Figure 7:
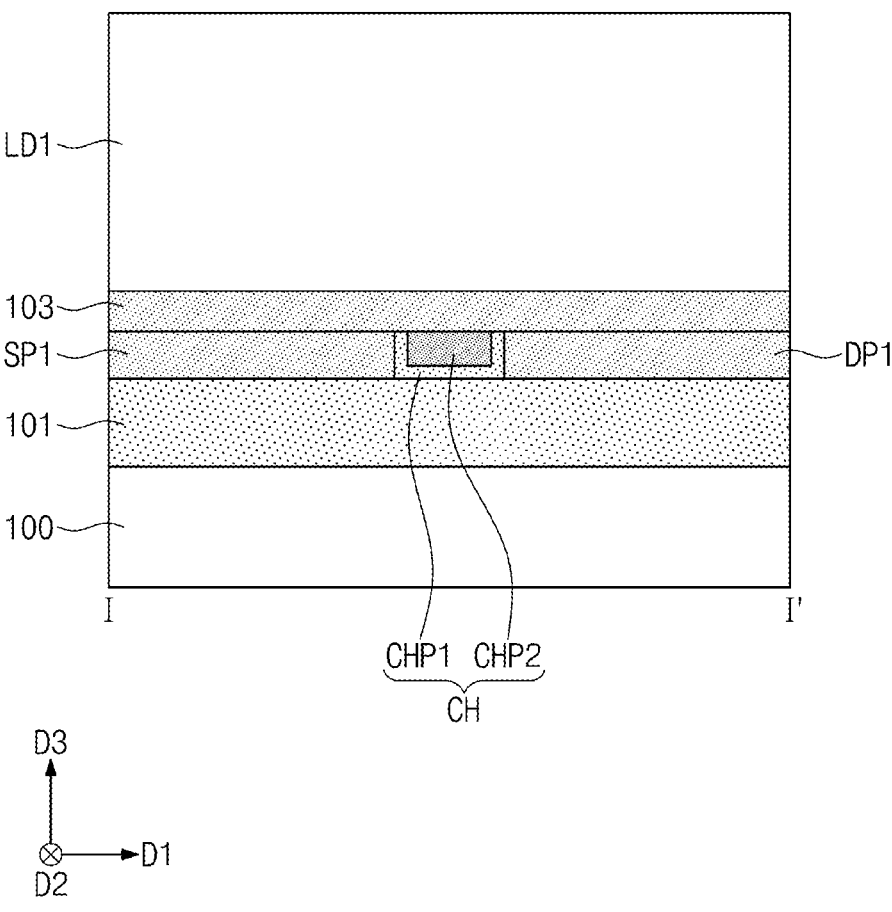

Referring to FIG. 7, a second electrode layer 103 may be formed to cover the channel layer CH, the first source pattern SP1, and the first drain pattern DP1. The second electrode layer 103 may be formed of the same material as that of the first source pattern SP1 and the first drain pattern DP1. The first interlayer dielectric layer ILD1 may be formed on the second electrode layer 103.

Figure 8:
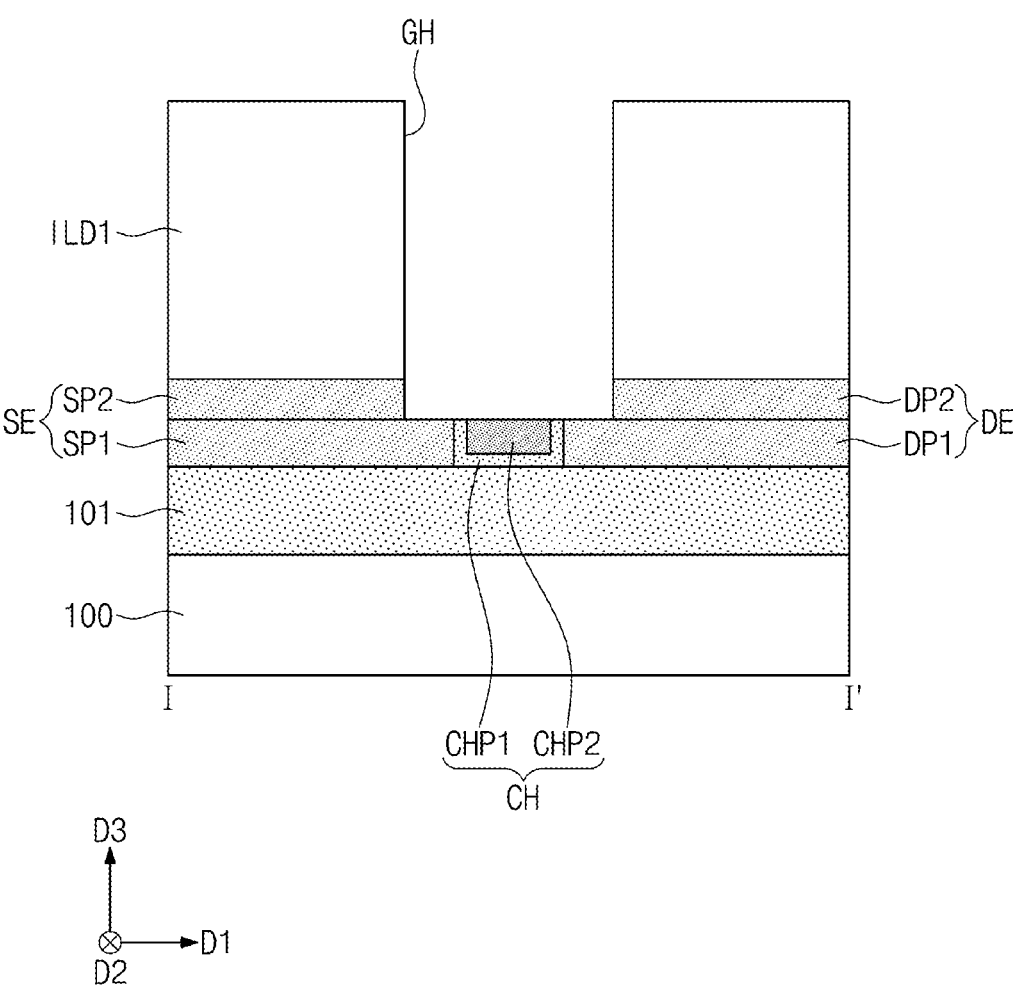

Referring to FIG. 8, a gate hole GH may be formed to penetrate the first interlayer dielectric layer ILD1 and the second electrode layer 103, and thus the second source pattern SP2 and the second drain pattern DP2 may be formed. As a result, the source electrode SE may be formed which includes the first source pattern SP1 and the second source pattern SP2, and the drain electrode DE may be formed which includes the first drain pattern DP1 and the second drain pattern DP2. The second source pattern SP2 and the second drain pattern DP2 may be spaced apart from each other in the second direction D2. The gate hole GH may expose at least a portion of the top surface of the first source pattern SP1, at least a portion of the top surface of the first drain pattern DP1, and the top surface of the channel layer CH. A width in the first direction D1 of the gate hole GH may be greater than a width in the first direction D1 of the channel layer CH.

Figure 9:
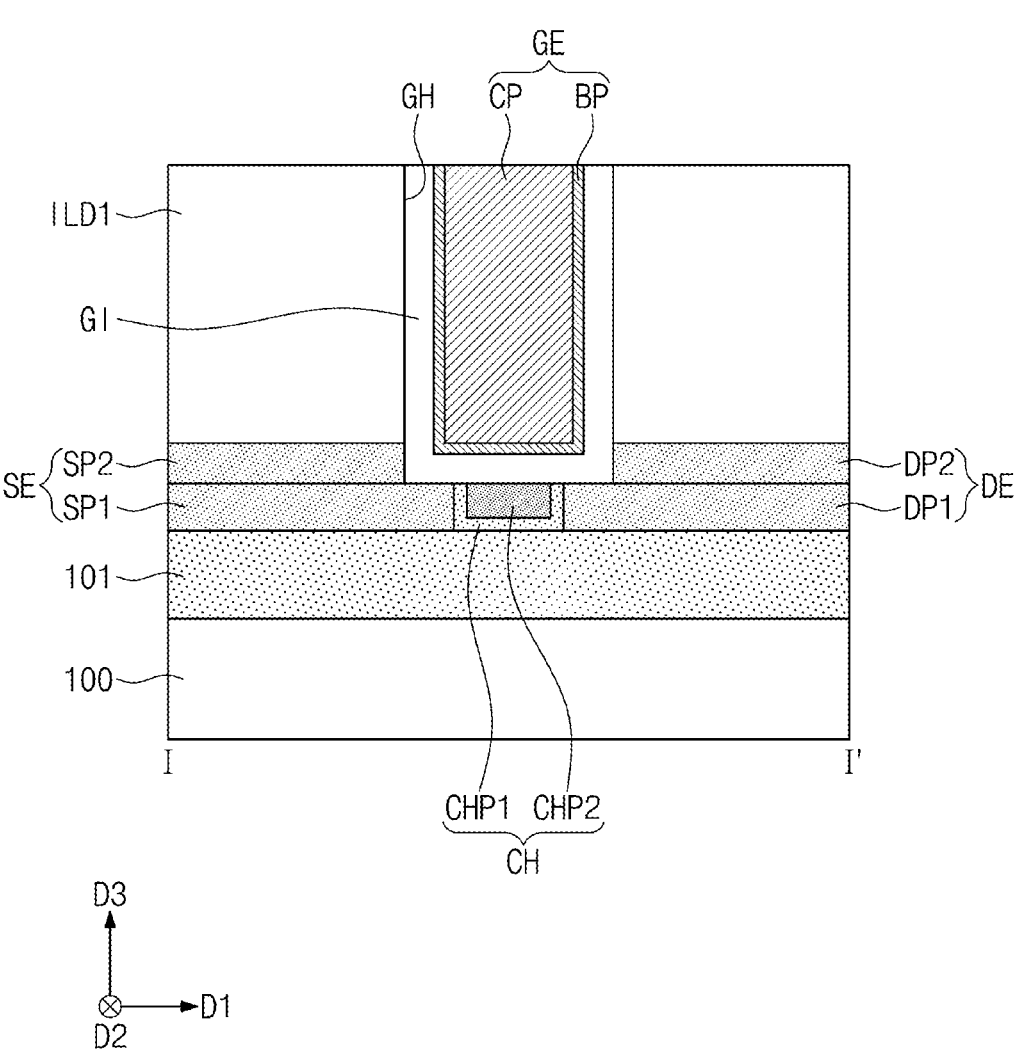

Referring to FIG. 9, the gate dielectric pattern GI may be conformally formed in the gate hole GH. The gate electrode GE may be formed to fill a space in the gate hole GH in which the gate dielectric pattern GI is formed to surround the space. The formation of the gate electrode GE may include forming the barrier pattern BP that conformally covers the space that is in the gate hole GH and is surrounded by the gate dielectric pattern GI, and forming the conductive pattern CP that fills the space in the gate hole GH in which the barrier pattern BP is formed to surround the space. The gate electrode GE may have a top surface substantially coplanar with that of the gate dielectric pattern GI and that of the first interlayer dielectric layer ILD1.

Referring back to FIGS. 1 to 3, the second interlayer dielectric layer ILD2 may be formed on the gate electrode GE and the first interlayer dielectric layer ILD1. The source contact SC and the drain contact DC may be formed to penetrate the first and second interlayer dielectric layers ILD1 and ILD2. Similar to the formation of the gate electrode GE, the formation of each of the source and drain contacts SC and DC may include conformally forming the barrier pattern BP and forming the conductive pattern CP that surrounds the barrier pattern BP. Afterward, the third interlayer dielectric layer ILD3 may be formed to cover the second interlayer dielectric layer ILD2, the source contact SC, and the drain contact DC. Wiring lines ML may be formed in the third interlayer dielectric layer ILD3.

Figure 10:
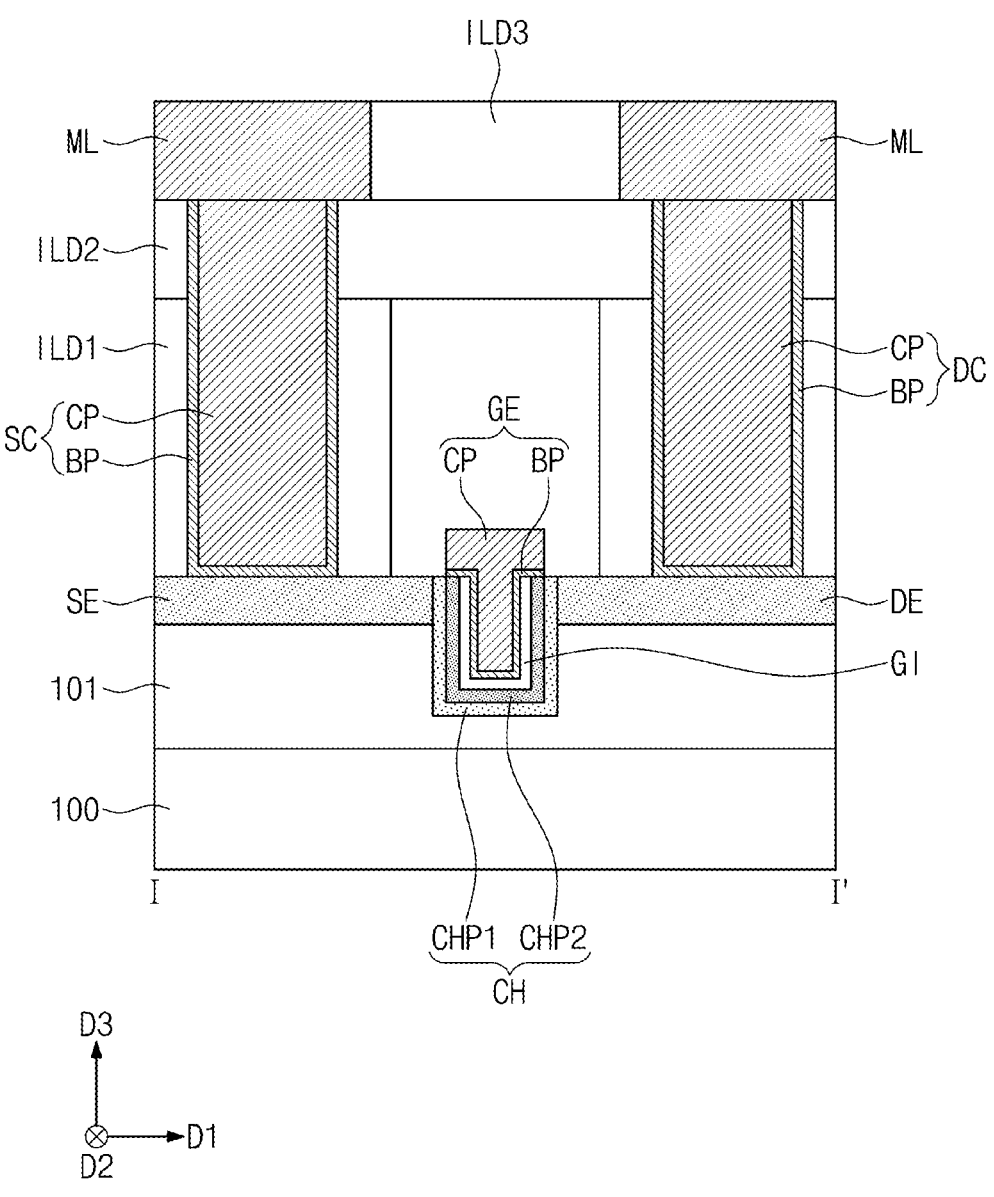
FIGS. 10 to 12 illustrate cross-sectional views along line I-I' of FIG. 1, showing a semiconductor device according to some embodiments.

FIG. 10 illustrates a cross-sectional view taken along line I-I' of FIG. 1, showing a semiconductor device according to some embodiments. For convenience of description, a description of contents substantially the same as that discussed with reference to FIGS. 1 to 4 will be omitted, and a difference thereof will be discussed in detail.

Referring to FIG. 10, the gate electrode GE may have a T-shape structure in which at least a portion of the gate electrode GE is buried in the oxide layer 101. The portion of the gate electrode GE buried in the oxide layer 101 may be located at, e.g., may extend to, a level lower than that of a bottom surface of the source electrode SE and lower than a bottom surface of the drain electrode DE. The portion of the gate electrode GE buried in, e.g., extending into, the oxide layer 101 may overlap in the first direction D1 (or horizontally) with the source electrode SE and the drain electrode DE across the channel layer CH. The channel layer CH may include first and second channel patterns CHP1 and CHP2 that conformally cover a bottom surface and opposite sidewalls of the gate electrode GE. The gate dielectric pattern GI may be interposed between the channel layer CH and the gate electrode GE.

Figure 11:
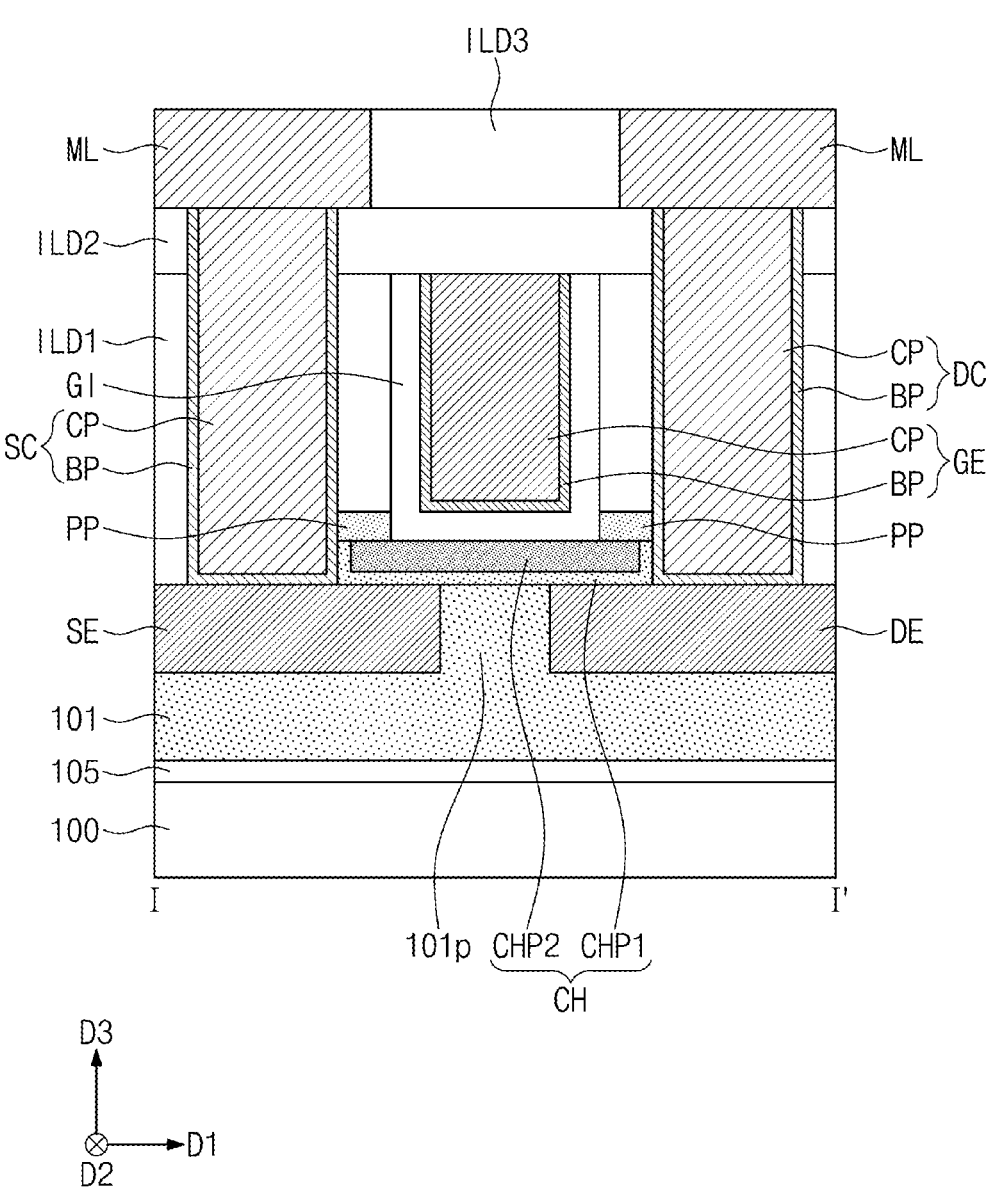

FIG. 11 illustrates a cross-sectional view taken along line I-I' of FIG. 1, showing a semiconductor device according to some embodiments. For convenience of description, a description of contents substantially the same as that discussed with reference to FIGS. 1 to 4 will be omitted, and a difference thereof will be discussed in detail.

Referring to FIG. 11, the oxide layer 101 may include a protrusion 101*p* that protrudes in the third direction D3. The protrusion 101*p* of the oxide layer 101 may be positioned between the source electrode SE and the drain electrode DE. The protrusion 101*p* of the oxide layer 101 may have a top surface substantially coplanar with that of the source electrode SE and that of the drain electrode DE.

The source contact SC and the drain contact DC may be provided therebetween with the channel layer CH that covers the protrusion 101*p* of the oxide layer 101, a portion of the source electrode SE, and a portion of the drain electrode DE. Each of sidewalls of the channel layer CH may be in contact with the source contact SC or the drain contact DC. The gate electrode GE may be provided on the channel layer CH. At least a portion of the gate electrode GE may overlap in the third direction D3 with at least a portion of the source electrode SE. At least a portion of the gate electrode GE may overlap in the third direction D3 with at least a portion of the drain electrode DE. The gate dielectric pattern GI may be interposed between the gate electrode GE and the channel layer CH, and may extend in the third direction D3 along opposite sidewalls of the gate electrode GE.

Passivation patterns PP may be provided between the source contact SC and the gate electrode GE and between the drain contact DC and the gate electrode GE. The passivation patterns PP may extend in the second direction D2 along opposite sidewalls of the gate electrode GE on the channel layer CH. The passivation patterns PP may be in direct contact with the top surface of the channel layer CH. Each of the passivation patterns PP may overlap in the third direction D3 (or vertically) with the source electrode SE or the drain electrode DE. The passivation patterns PP may minimize and/or prevent hydrogen from entering the channel layer CH in a subsequent process (or annealing process). The passivation patterns PP may include, e.g., silicon nitride or aluminum oxide.

Figure 12:
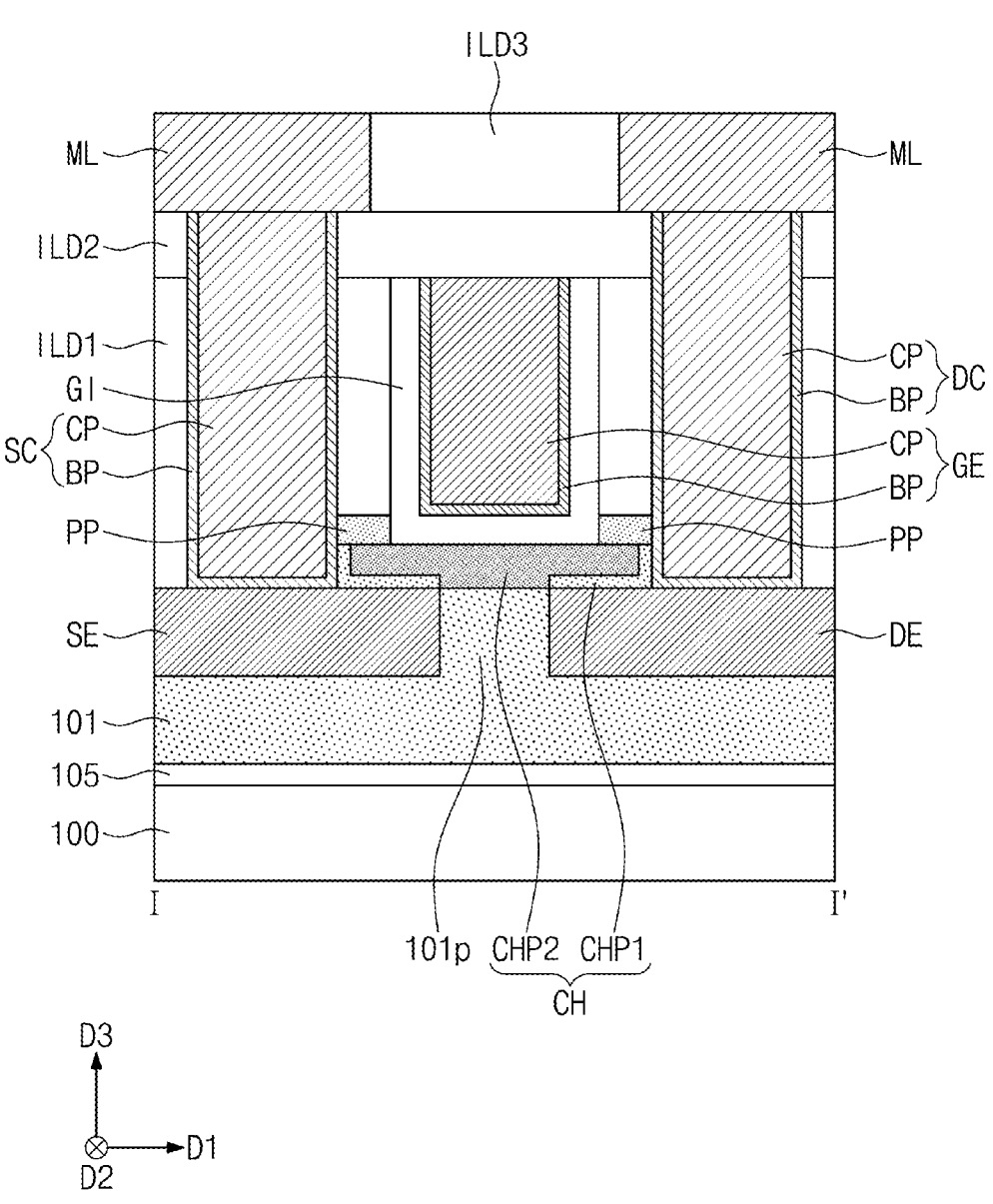

FIG. 12 illustrates a cross-sectional view taken along line I-I' of FIG. 1, showing a semiconductor device according to some embodiments. For convenience of description, a description of contents substantially the same as that discussed with reference to FIGS. 1 to 4 and 11 will be omitted, and a difference thereof will be discussed in detail.

Referring to FIG. 12, the first channel pattern CHP1 of the channel layer CH may not be formed on the top surface of the protrusion 101p of the oxide layer 101. For example, the first channel pattern CHP1 of the channel layer CH may be selectively provided on the top surface of the source electrode SE and on the top surface of the drain electrode DE. At least a portion of the second channel pattern CHP2 of the channel layer CH may be in direct contact with the top surface of the protrusion 101p of the oxide layer 101.

Figure 13:
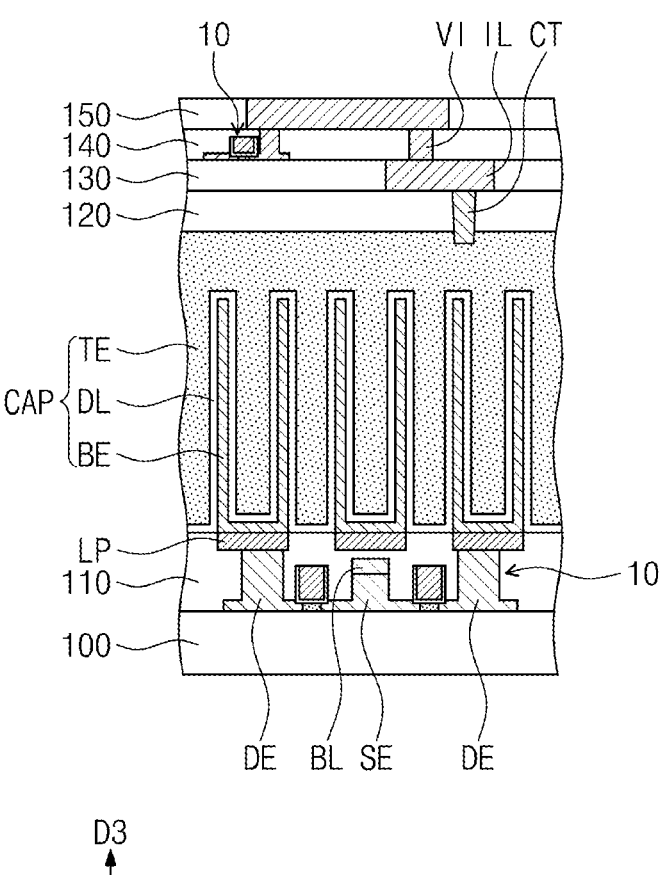
FIGS. 13 and 14 illustrate cross-sectional views showing a semiconductor device according to some embodiments.
Figure 14:
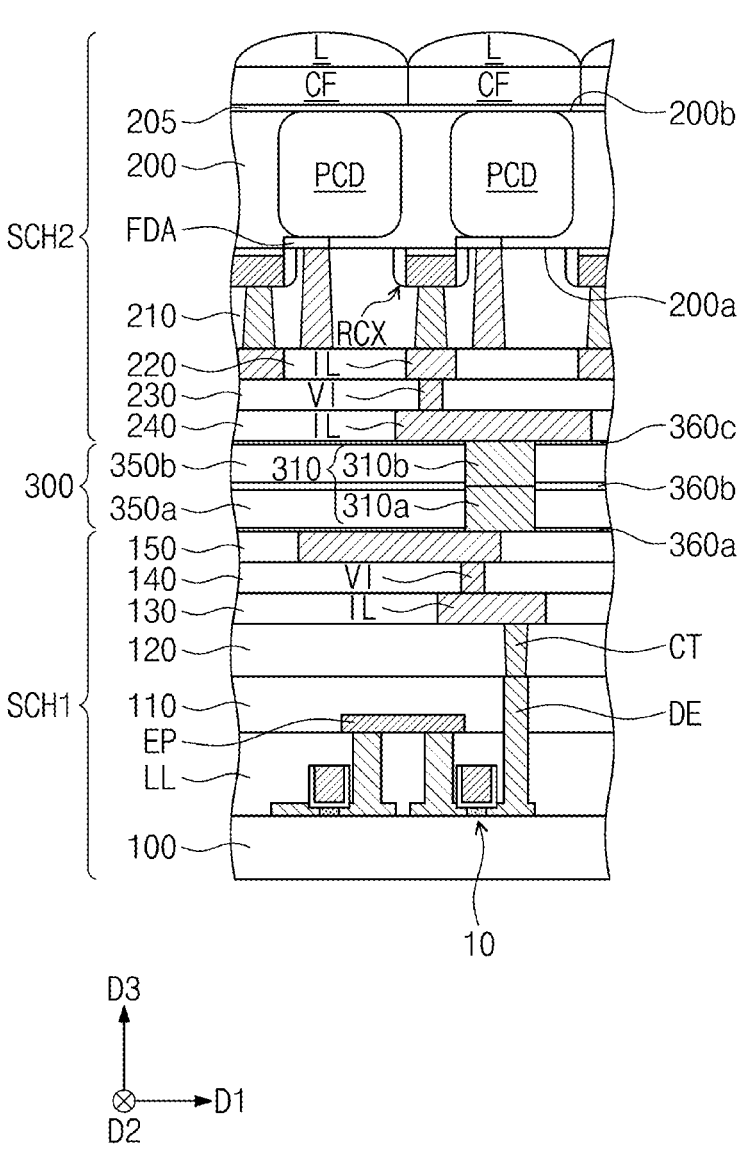
Figure 15:
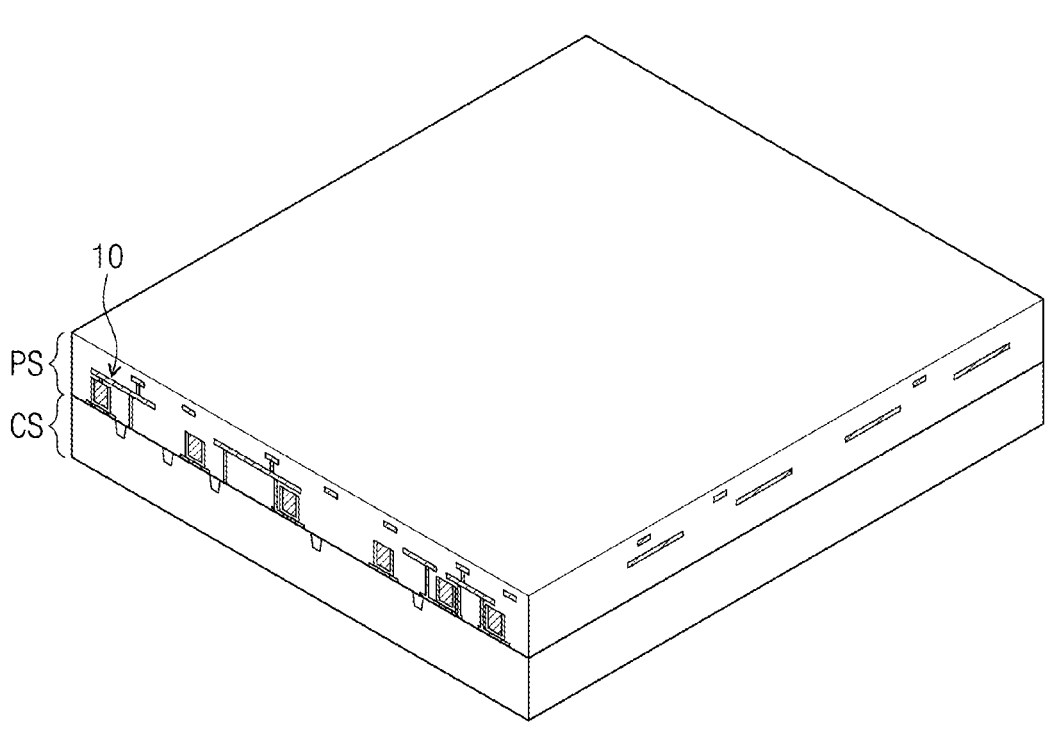
FIG. 15 illustrates a perspective view showing a semiconductor device according to some embodiments.

FIGS. 13 and 14 illustrate cross-sectional views showing a semiconductor device according to some embodiments. FIG. 15 illustrates a perspective view showing a semiconductor device according to some embodiments. With reference to FIGS. 13 to 15, the following will describe implemented examples of a semiconductor device according to some embodiments.

Referring to FIG. 13 a semiconductor memory cell including semiconductor devices 10 according to embodiments may be illustrated. The semiconductor memory cell may be, e.g., a dynamic random access memory (DRAM) cell. The semiconductor memory cell may include the semiconductor devices 10 on the substrate 100, according to embodiments, and may also include a capacitor CAP connected to the semiconductor devices 10.

The substrate 100 may be provided thereon with the semiconductor devices 10 according to embodiments. A pair of neighboring semiconductor devices 10 may share the source electrode SE. For example, the source electrode SE may be provided between the pair of neighboring semiconductor devices 10.

The substrate 100 may be provided thereon with a first dielectric layer 110 that covers the semiconductor devices 10 according to embodiments. The first dielectric layer 110 may include at least one of, e.g., silicon oxide, silicon nitride, and silicon oxynitride.

Bit lines BL may be provided in the first dielectric layer 110. Each of the bit lines BL may be provided on the source electrode SE that is shared by a pair of neighboring semiconductor devices 10. The bit lines BL may include at least one of, e.g., doped semiconductor materials, conductive metal nitrides, metallic materials, and metal-semiconductor compounds.

Landing pads LP may be provided in the first dielectric layer 110. Each of the landing pads LP may be provided on the drain electrode DE of the semiconductor device 10. Each of the landing pads LP may include a conductive material, e.g., metal or doped silicon.

The capacitor CAP may be provided on the first dielectric layer 110. The capacitor CAP may include bottom electrodes BE, a top electrode TE, and a dielectric layer DL interposed between the bottom electrodes BE and the top electrode TE. The bottom electrodes BE may be provided on corresponding landing pads LP. Each of the bottom electrodes BE may be electrically connected to the drain electrode DE through one of the landing pads LP. The bottom electrodes BE may be linearly arranged along the first direction D1.

Each of the bottom electrodes BE may have a cylindrical (or cup) shape that has a bottom portion and a sidewall portion that vertically extends from the bottom portion. The bottom portion and the sidewall portion of each bottom electrode BE may have substantially the same thickness. When viewed in a plan view, the bottom electrodes BE may have substantially the same diameter.

The bottom electrodes BE may include at least one of, e.g., doped semiconductor materials, conductive metal nitrides, metallic materials, and metal-semiconductor compounds. For example, the bottom electrodes BE may include a metal nitride layer, e.g., a titanium nitride (TiN) layer, a titanium silicon nitride (TiSiN) layer, a titanium aluminum nitride (TiAlN) layer, a tantalum nitride (TaN) layer, tantalum silicon nitride (TaSiN) layer, tantalum aluminum nitride (TaAlN) layer, and a tungsten nitride (WN) layer.

The dielectric layer DL may be provided to have a uniform thickness on surfaces of the bottom electrodes BE. The dielectric layer DL may include a high-k dielectric material, e.g., $HfO_2$, $ZrO_2$, $Al_2O_3$, $La_2O_3$, $Ta_2O_3$, and $TiO_2$.

The top electrode TE may be provided on the dielectric layer DL. The top electrode TE may cover a plurality of bottom electrodes BE across the dielectric layer DL. Portions of the top electrode TE may fill insides of the bottom electrodes BE. The top electrode TE may include at least one of, e.g., doped semiconductor materials, conductive metal nitrides, metallic materials, and metal-semiconductor compounds. For example, the top electrode TE may have a structure in which a metal nitride and a semiconductor material are sequentially stacked.

A front-end-of-line (FEOL) process may be performed to form the semiconductor devices 10, the first dielectric layer 110, the landing pads LP, and the capacitor CAP on the substrate 100.

Second, third, fourth, and fifth dielectric layers 120, 130, 140, and 150 may be stacked on the capacitor CAP. The second dielectric layer 120 may be provided therein with at least one contact CT that penetrates the second dielectric layer 120 and electrically connects to the top electrode TE. The third, fourth, and fifth dielectric layers 130, 140, and 150 may be provided therein with wiring lines IL, vias VI, and the semiconductor devices 10 according to embodiments. The semiconductor device 10 may be provided in one of the second, third, fourth, and fifth dielectric layers 120, 130, 140, and 150, and may be electrically connected to one of the wiring lines IL. The vias VI may vertically connect the wiring lines IL to each other. The wiring lines IL of the semiconductor memory cell may be electrically connected through a contact CT to the capacitor CAP.

A back-end-of-line (BEOL) process may be performed to form the wiring lines IL, the semiconductor devices 10, and the vias VI provided in the second, third, fourth, and fifth dielectric layers 120, 130, 140, and 150.

Referring to FIG. 14, an image sensor chip including the semiconductor devices 10 according to embodiments is illustrated. The image sensor chip may include a first sub-chip SCH1, a second sub-chip SCH2, and an insert layer 300.

The first sub-chip SCH1 may include the first substrate 100, a circuit layer LL on the first substrate 100, and the first, second, third, fourth, and fifth dielectric layers 110, 120, 130, 140, and 150 on the first substrate 100.

The circuit layer LL may include the semiconductor devices 10 according to embodiments. The semiconductor devices 10 may be spaced apart from each other and two-dimensionally arranged on the first substrate 100. The semiconductor devices 10 may be logic transistors that process signals transmitted from the second sub-chip SCH2. The first, second, third, fourth, and fifth dielectric layers 110, 120, 130, 140, and 150 may be sequentially provided on the circuit layer LL.

Lower wiring lines EP may be provided in the first dielectric layer 110. One of the lower wiring lines EP may be commonly provided on a source electrode and a drain electrode of neighboring semiconductor devices 10. A drain electrode and a source electrode of a pair of neighboring semiconductor devices 10 may be electrically connected to each other through one of the lower wiring lines EP. A drain electrode DE that is not connected to the lower wiring lines EP may penetrate the first dielectric layer 110. The lower wiring line EP may include a conductive material, e.g., doped silicon or metal.

At least one contact CT may be provided to penetrate the second dielectric layer 120 and to electrically connect to the drain electrode DE that is not connected to the lower wiring lines EP. Wiring lines IL and vias VI may be provided in the third, fourth, and fifth dielectric layers 130, 140, and 150. The vias VI may vertically connect the wiring lines IL to each other. The wiring lines IL of the first sub-chip SCH1 may be electrically connected through the contact CT to the semiconductor device 10 in the circuit layer LL.

The second sub-chip SCH2 may include photoelectric conversion elements PCD, floating diffusion regions FDA, and readout circuit elements RCX, all of which components are formed on a second substrate 200. The second substrate 200 may be a semiconductor substrate doped with impurities to have a second conductivity type (e.g., p-type).

The readout circuit elements RCX may be provided on a first surface 200a of the second substrate 200. The readout circuit elements RCX may include a plurality of transistors each of which transfer and amplify an electrical signal (e.g., photo-charge) that corresponds to incident light.

The second surface 200b of the second substrate 200 may be provided thereon with color filters CF and microlenses L. The color filters CF and microlenses L provide the photo-electric conversion element PCD with incident light. The second surface 200b may be opposite to the first surface 200a.

Each of the photoelectric conversion elements PCD may include a photodiode. The photoelectric conversion elements PCD may be provided in the second substrate 200. The photoelectric conversion elements PCD may generate photo-charges corresponding to incident light. For example, each of the photoelectric conversion elements PCD may generate an electron-hole pair corresponding to incident light. The photoelectric conversion elements PCD may be doped with impurities to have a second conductivity type (e.g., n-type) different from that of the second substrate 200.

The color filters CF may be provided on corresponding photoelectric conversion elements PCD. The color filters CF may be arranged in a matrix shape to constitute a color filter array.

For example, the color filter array may include a Bayer pattern consisting of a red filter, a green filter, and a blue filter. Each of the color filters CF may be one of the red, green, and blue filters.

In another example, the color filter array may include a Bayer pattern consisting of a yellow filter, a magenta filter, and a cyan filter. Each of the color filters CF may be one of the yellow, magenta, and cyan filters.

The microlenses L may be provided on corresponding color filters CF. The microlens L may control a path of light incident thereon in such a way that the incident light is collected to the photoelectric conversion element PCD that underlies the microlens L. The microlenses L may be arranged in a matrix shape to constitute a microlens array.

An antireflective layer 205 may be provided between the color filters CF and the second surface 200b of the second substrate 200. The antireflective layer 205 may minimize and/or prevent incident light from being reflected on the second surface 200b of the second substrate 200. According to some embodiments, the antireflective layer 205 may have a multi-layered structure where materials having different refractive indices are alternately stacked. The antireflective layer 205 may improve its transmittance with increasing the number of stacked materials having different refractive indices.

First, second, third, and fourth upper dielectric layers 210, 220, 230, and 240 may be stacked on the first surface 200a of the second substrate 200. Wiring lines IL and vias VI may be provided in the first, second, third, and fourth upper dielectric layers 210, 220, 230, and 240. The vias VI may vertically connect the wiring lines IL to each other. The wiring lines IL of the second sub-chip SCH2 may be electrically connected to the readout circuit elements RCX.

The photoelectric conversion elements PCD of the second sub-chip SCH2 may generate photo-charges in response to light incident on the second surface 200b of the second substrate 200. For example, the image sensor chip according to the present embodiment may be a backside illuminated image sensor (BIS).

An interconnector 310 may be included in the insert layer 300 between the first and second sub-chips SCH1 and SCH2. The interconnector 310 may electrically connect the wiring lines IL of the first sub-chip SCH1 to the wiring lines IL of the second sub-chip SCH2. The interconnector 310 may include metal, e.g., copper and/or tungsten.

For example, the interconnector 310 may include a first conductive pattern 310a electrically connected to at least one wiring line IL of the first sub-chip SCH1 and a second conductive pattern 310b electrically connected to at least one wiring line IL of the second sub-chip SCH2. The first and second conductive patterns 310a and 310b may be in contact with each other and thereby electrically connected to each other.

The insert layer 300 may further include a first dielectric layer 350a and a second dielectric layer 350b. The first and second conductive patterns 310a and 310b may be provided respectively in the first and second dielectric layers 350a and 350b. The first and second dielectric layers 350a and 350b may include, e.g., silicon oxide.

The insert layer 300 may further include a first metal diffusion break layer 360a, a second metal diffusion break layer 360b, and a third metal diffusion break layer 360c. The first metal diffusion break layer 360a may be interposed between the first sub-chip SCH1 and the first dielectric layer 350a, the second metal diffusion break layer 360b may be interposed between the first dielectric layer 350a and the second dielectric layer 350b, and the third metal diffusion break layer 360c may be interposed between the second dielectric layer 350b and the second sub-chip SCH2. The first, second, and third metal diffusion break layers 360a, 360b, and 360c may include, e.g., SiN, SiCN, SiOCN, SiON, or SiC. The first, second, and third metal diffusion break layers 360a, 360b, and 360c may minimize and/or prevent metal constituents from being diffused from the interconnector 310.

Referring to FIG. 15, a semiconductor apparatus including semiconductor devices 10 according to embodiments is illustrated. The semiconductor apparatus may include a cell array structure CS and a peripheral circuit structure PS. The peripheral circuit structure PS may be stacked on the cell array structure CS. For example, the peripheral circuit structure PS and the cell array structure CS may, e.g., vertically, overlap each other. According to some embodiments, the peripheral circuit structure PS of the semiconductor apparatus may be provided below the cell array structure CS of the semiconductor apparatus.

The cell array structure CS may include a plurality of memory cells. According to some embodiments, the memory cell may include a semiconductor memory cell, or DRAM cell, discussed with reference to FIG. 13. According to other embodiments, the memory cell may include a NAND cell or a static random access memory (SRAM) cell.

The peripheral circuit structure PS may include, e.g., a row decoder, a column decoder, a page buffer, and a control circuit that control a cell array. Circuits included in the peripheral circuit structure PS may be formed of the semiconductor devices 10 according to embodiments.

By way of summation and review, embodiments provide a semiconductor device with improved electrical properties and increased reliability, a method of fabricating the same, and a semiconductor memory cell including the same. That is, according to embodiments, a lower contact resistance and a high mobility may be obtained through a channel layer that includes channel patterns including, e.g., consisting of, different oxide semiconductor materials from each other. In addition, according to embodiments, a portion of a source electrode and a portion of a drain electrode may overlap a portion of a gate electrode, and thus resistance between a source/drain and a channel may be reduced to complement a low mobility of an oxide semiconductor material. Accordingly, it may be possible to improve reliability and electrical properties of a semiconductor device and a semiconductor memory cell including the same according to embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate;
a gate electrode on the substrate;
a channel layer between the substrate and the gate electrode;

14 a source electrode in contact with a first sidewall of the channel layer; and
a drain electrode in contact with a second sidewall of the channel layer, the second sidewall being opposite to the first sidewall,
wherein the channel layer includes:
a first channel pattern that defines the first sidewall of the channel layer and the second sidewall of the channel layer, and
a second channel pattern between the first channel pattern and the gate electrode, the first channel pattern covering a first sidewall of the second channel pattern, a second sidewall of the second channel pattern opposite the first sidewall of the second channel pattern, and a bottom surface of the second channel pattern,
wherein the first channel pattern is formed of a first oxide semiconductor material, and the second channel pattern is formed of a second oxide semiconductor material different than the first oxide semiconductor material, and
wherein a portion of the source electrode and a portion of the drain electrode overlap a portion of the gate electrode.
2. The semiconductor device as claimed in claim 1, wherein the channel layer includes a compound of oxygen (O) and at least two metals selected from zinc (Zn), indium (In), gallium (Ga), and tin (Sn).
3. The semiconductor device as claimed in claim 1, wherein:
the first channel pattern includes a crystalline oxide semiconductor material, and
the second channel pattern includes an amorphous oxide semiconductor material.
4. The semiconductor device as claimed in claim 1, wherein a contact resistance of the first channel pattern is less than a contact resistance of the second channel pattern.
5. The semiconductor device as claimed in claim 1, wherein a mobility of the first channel pattern is less than a mobility of the second channel pattern.
6. The semiconductor device as claimed in claim 1, wherein the portion of the source electrode and the portion of the drain electrode vertically overlap the portion of the gate electrode.
7. The semiconductor device as claimed in claim 1, wherein:
the source electrode and the drain electrode are spaced apart from each other in a first direction parallel to a top surface of the substrate,
the gate electrode extends in a second direction that intersects the first direction and is parallel to the top surface of the substrate,
the source electrode includes:
a first source pattern in contact with the channel layer, and
a second source pattern on the first source pattern, the second source pattern overlapping in the first direction with a part of the gate electrode,
the drain electrode includes:
a first drain pattern in contact with the channel layer, and
a second drain pattern on the first drain pattern, the second drain pattern overlapping in the first direction with the part of the gate electrode,
a length in the first direction of the second source pattern is less than a length in the first direction of the first source pattern, and a length in the first direction of the second drain pattern is less than a length in the first direction of the first drain pattern.

8. The semiconductor device as claimed in claim 1, wherein the second channel pattern is formed of amorphous indium-gallium-zinc oxide, $In_2O_3$, or indium-tungsten oxide and has a constitution ratio of indium greater than 1 to 3.

9. A semiconductor device, comprising:
a substrate;
a gate electrode on the substrate;
a channel layer between the substrate and the gate electrode;
a source electrode in contact with a first sidewall of the channel layer; and
a drain electrode in contact with a second sidewall of the channel layer, the second sidewall being opposite to the first sidewall,
wherein the source electrode and the drain electrode are spaced apart from each other in a first direction parallel to a top surface of the substrate,
wherein the gate electrode extends in a second direction that intersects the first direction and is parallel to the top surface of the substrate,
wherein the channel layer includes:
a first channel pattern that defines the first sidewall of the channel layer and the second sidewall of the channel layer, and
a second channel pattern between the first channel pattern and the gate electrode, the first channel pattern covering a first sidewall of the second channel pattern, a second sidewall of the second channel pattern opposite the first sidewall of the second channel pattern, and a bottom surface of the second channel pattern,
wherein the first channel pattern is formed of a first oxide semiconductor material, and the second channel pattern is formed of a second oxide semiconductor material that is different than the first oxide semiconductor material, and
wherein a portion of the source electrode and a portion of the drain electrode overlap in a third direction with a portion of the gate electrode, the third direction being perpendicular to the top surface of the substrate.

10. The semiconductor device as claimed in claim 9, wherein:
the first channel pattern includes c-axis aligned crystal indium-gallium-zinc oxide (CAAC-IGZO) or indium-tin oxide (ITO), and the second channel pattern includes indium-gallium-zinc oxide (IGZO), $In_2O_3$, or indium-tungsten oxide (IWO).

11. A semiconductor memory cell, comprising:
a substrate;
a semiconductor device on the substrate;
a landing pad on the semiconductor device; and
a capacitor that includes bottom electrodes, a top electrode, and a dielectric layer between the bottom electrodes and the top electrode, the capacitor being connected through the landing pad to the semiconductor device, wherein the semiconductor device includes:
a gate electrode on the substrate,
a channel layer between the substrate and the gate electrode,
a source electrode in contact with a first sidewall of the channel layer, and
a drain electrode in contact with a second sidewall of the channel layer, the second sidewall being opposite to the first sidewall,
wherein the channel layer of the semiconductor device includes:
a first channel pattern that defines the first sidewall of the channel layer and the second sidewall of the channel layer, the first channel pattern including a crystalline oxide semiconductor material, and
a second channel pattern between the first channel pattern and the gate electrode, the second channel pattern including an amorphous oxide semiconductor material, the first channel pattern covering a first sidewall of the second channel pattern, a second sidewall of the second channel pattern opposite the first sidewall of the second channel pattern, and a bottom surface of the second channel pattern,
wherein the first channel pattern is formed of a first oxide semiconductor material, and the second channel pattern is formed of a second oxide semiconductor material that is different than the first oxide semiconductor material, and
wherein a portion of the source electrode and a portion of the drain electrode overlap a portion of the gate electrode.

12. The semiconductor memory cell as claimed in claim 11, further comprising a bit line on the source electrode,
wherein the drain electrode is connected through the landing pad to the capacitor.

* * * * *